United States Patent [19]
White et al.

[11] Patent Number: 5,261,081
[45] Date of Patent: Nov. 9, 1993

[54] SEQUENCE CONTROL APPARATUS FOR PRODUCING OUTPUT SIGNALS IN SYNCHRONOUS WITH A CONSISTENT DELAY FROM RISING OR FALLING EDGE OF CLOCK INPUT SIGNAL

[75] Inventors: Daniel F. White; Nathaniel C. Herwig, both of Lawrenceville; Barry D. Briggs, Lilburn, all of Ga.

[73] Assignee: NCR Corporation, Dayton, Ohio

[21] Appl. No.: 557,811

[22] Filed: Jul. 26, 1990

[51] Int. Cl.⁵ .................. G06F 15/00; G06F 1/12
[52] U.S. Cl. .................. 395/550; 364/934; 364/270; 364/271; 364/DIG. 1
[58] Field of Search .............. 395/550, 375, 325; 375/118; 377/76; 368/120

[56] References Cited

U.S. PATENT DOCUMENTS

| | | | |
|---|---|---|---|
| 3,643,220 | 2/1972 | Katagi | 395/550 |
| 3,774,157 | 11/1973 | Tsui | 395/550 |
| 3,919,695 | 11/1975 | Gooding | 395/550 |
| 4,172,281 | 10/1979 | Gordon | 395/375 |
| 4,191,998 | 3/1980 | Carmody | 395/550 |
| 4,231,104 | 10/1980 | St. Clair | 395/550 |
| 4,241,418 | 12/1980 | Stanley | 395/550 |
| 4,386,401 | 5/1983 | O'Brien | 395/550 |
| 4,407,014 | 9/1983 | Holtey et al. | 395/550 |
| 4,415,984 | 11/1983 | Gryger et al. | 395/550 |
| 4,439,046 | 3/1984 | Hoppe | 368/120 |
| 4,622,665 | 11/1986 | Jonsson et al. | 370/105.3 |
| 4,648,102 | 3/1987 | Riso et al. | 395/325 |
| 4,654,804 | 3/1987 | Thaden et al. | 364/232.8 |
| 4,733,347 | 3/1988 | Fuknoka | 395/650 |
| 4,734,880 | 3/1988 | Collins | 377/76 |
| 4,764,687 | 8/1988 | Hamilton et al. | 307/269 |
| 4,802,120 | 1/1989 | McCoy | 395/550 |
| 4,841,551 | 6/1989 | Avaneas | 375/118 |

*Primary Examiner*—Thomas C. Lee
*Assistant Examiner*—Meng-Ai T. An
*Attorney, Agent, or Firm*—Albert L. Sessler, Jr.

[57] ABSTRACT

Sequence control apparatus provides a plurality of output signals selectively based upon either the rising or falling edge of a clock signal. The apparatus includes a plurality of groups of bistable devices such as flip flops. In each group, half of the flip flops are triggered by the rising edge of a clock pulse and the other half of the flip flops are triggered by the falling edge. The outputs of these flip flops are coupled to a series of gates, which in turn are controlled by logic input select signals to provide output signals which may be used, for example, for memory control purposes. The output signal from one group of flip flops is provided as an input signal for the next group.

23 Claims, 8 Drawing Sheets

SEQUENCE CONTROL APPARATUS FOR PRODUCING OUTPUT SIGNALS IN SYNCHRONOUS WITH A CONSISTENT DELAY FROM RISING OR FALLING EDGE OF CLOCK INPUT SIGNAL

BACKGROUND OF THE INVENTION

This invention relates to a sequence control apparatus, and more particularly relates to a sequence control apparatus for providing a plurality of output signals selectively based upon either the rising edge of a clock signal or the falling edge of a clock signal.

State controllers are widely employed in electronic digital circuitry to determine and change the states of components of the circuitry with respect to the states of other components. One example of such circuitry is that which is used in control of memory devices, in which row address strobe, column address strobe and multiplex address switch signals are required. As the speed of operation of the circuitry increases, the need for higher speed in the operation of the state machine also increases, in order to provide a finer resolution for control of various components of the circuitry. One way in which this has been done is to employ a higher speed clock for the state machine. However this may not always be feasible to do, since such a clock may not be readily available, for reasons such as expense, reliability, difficulty of synchronization and power dissipation.

SUMMARY OF THE INVENTION

In the present invention, a sequence control apparatus, or programmable sequencer, is provided in which output signals can be produced in half-count clock cycle increments, by generating pulses off both the rising and falling edges of clock signals, thus yielding half-clock resolution of the input clock. The apparatus is programmable to provide different signal sequences, and can operate at various frequencies.

In accordance with one embodiment of the invention, sequence control apparatus for providing a plurality of output signals selectively based upon either a rising edge of a clock signal or a falling edge of a clock signal, comprises: clock input signal means; clock input signal inverter means having an input coupled to the clock input signal means and an output; state controller means comprising a first plurality of devices clocked by said clock signal input means and a second plurality of devices clocked by signals from the output of said clock signal inverter means and which can produce a plurality of output signals; means to initiate operation of said state controller means; gating means coupled to said state controller means to receive a plurality of said output signals from said state controller means and having output means on which appears an output signal for the sequence control apparatus; logic select input means coupled to said gating means for selecting a desired one of the output signals from said state controller means to appear on the output means of the gating means; second state controller means comprising a first plurality of devices clocked by said clock input signal means and a second plurality of devices clocked by signals from the output of said clock signal inverter means, and which can produce a plurality of output signals; means for coupling the output means of said gating means to said second state controller means to perform operation thereof; second gating means coupled to said second state controller means to receive a plurality of said output signals from said second state controller means and having an output means on which appears a second output signal for the sequence control apparatus; and second logic select input means coupled to said second gating means for selecting a desired one of the output signals from said second state controller means to appear on the output means of the second gating means.

In accordance with a second embodiment of the invention, sequence control apparatus for providing a plurality of output signals selectively based upon either a rising edge of a clock signal or a falling edge of a clock signal, comprises: first, second, third and fourth bistable means, each having a reset input, a clock input, a data input and a data output; means coupling the data output of the first bistable means to the data input of the third bistable means; means coupling the data output of the second bistable means to the data input of the fourth bistable means; clock input signal means coupled to the clock inputs of the first and third bistable means; clock inverter means having an input coupled to the clock input means and an output; means coupling the output of the clock inverter means to the clock inputs of the second and fourth bistable means; reset signal means coupled to the reset inputs of the first, second, third and fourth bistable means; start cycle input means coupled to the data inputs of the first and second bistable means; first, second, third and fourth gate means of a first type, said first gate means of the first type having one input coupled to an output of the first bistable means, said second gate means of the first type having one input coupled to an input of the second bistable means, said third gate means of the first type having one input coupled to an output of the third bistable means, and said fourth gate means of the first type having one input coupled to an output of the fourth bistable means; first logic select input means coupled to a second input of said first gate means of the first type for selecting the output of said first gate means of the first type; second logic select input means coupled to a second input of said second gate means of the first type for selecting the output of said second gate means of the first type; third logic select input means coupled to a second input of said third gate means of the first type for selecting the output of said third gate means of the first type; fourth logic select input means coupled to a second input of said fourth gate means of the first type for selecting the output of said fourth gate means of the first type; first gate means of a second type coupled to the outputs of said first and second gate means of the first type; second gate means of a second type coupled to the outputs of said third and fourth gate means of the first type; and first gate means of a third type coupled to the outputs of said first and second gate means of the second type and having output means on which appears an output signal for the sequence control apparatus.

In accordance with a third embodiment of the invention, sequence control apparatus for providing a plurality of output signals selectively based upon either the rising edge of a clock signal or the falling edge of a clock signal, comprising: first, second, third and fourth flip flop means each having a reset input, a clock input, a data input and a data output; means coupling the data output of the first flip flop means to the data input of the third flip flop means; means coupling the data output of the second flip flop means to the data input of the fourth flip flop means; clock input signal means coupled to the clock inputs of the first and third flip flop means; clock inverter means having an input coupled to the clock input means and an output; means coupling the output of the clock inverter means to the clock inputs of the second and fourth flip flop means; reset signal means coupled to the reset inputs of the first, second, third and fourth flip flop means; start cycle input means coupled to the data inputs of the first and second flip flop means; first, second, third and fourth AND gate means, said first AND gate means having one input coupled to an output of the first flip flop means, said second AND gate means having one input coupled to an output of the second flip flop means, said third AND gate means having one input coupled to an output of the third flip flop means, and said fourth AND gate means having one input coupled to an output of the fourth flip flop means; first logic select input means coupled to a second input of said first AND gate means for selecting the output of said first AND gate means; second logic select input means coupled to a second input of said second AND gate means for selecting the output of said second AND gate means; third logic select input means coupled to a second input of said third AND gate means for selecting the output of said third AND gate means; fourth logic select input means coupled to a second input of said fourth AND gate means for selecting the output of said fourth AND gate means; first NOR gate means coupled to the outputs of said first and second AND gate means; second NOR gate means coupled to the outputs of said third and fourth AND gate means; and NAND gate means coupled to the outputs of said first and second NOR gate means and having output means on which appears an output signal for the sequence control apparatus.

It is accordingly an object of the present invention to provide a sequencing apparatus which is programmable and which can generate pulses from both the falling and rising edges of a clock signal.

Another object is to provide a sequencing apparatus which comprises a plurality of interconnected programmable state controllers.

Another object is to provide a programmable sequencing apparatus capable of activating memory row address strobe signals, column address strobe signals and multiplex address switch signals With these and other objects, which will become apparent from the following description, in view, the invention includes certain novel features and combinations of parts, a preferred form or embodiment of which is hereafter described with reference to the drawings which accompany and form a part of this specification.

DETAILED DESCRIPTION

Figure 1A:
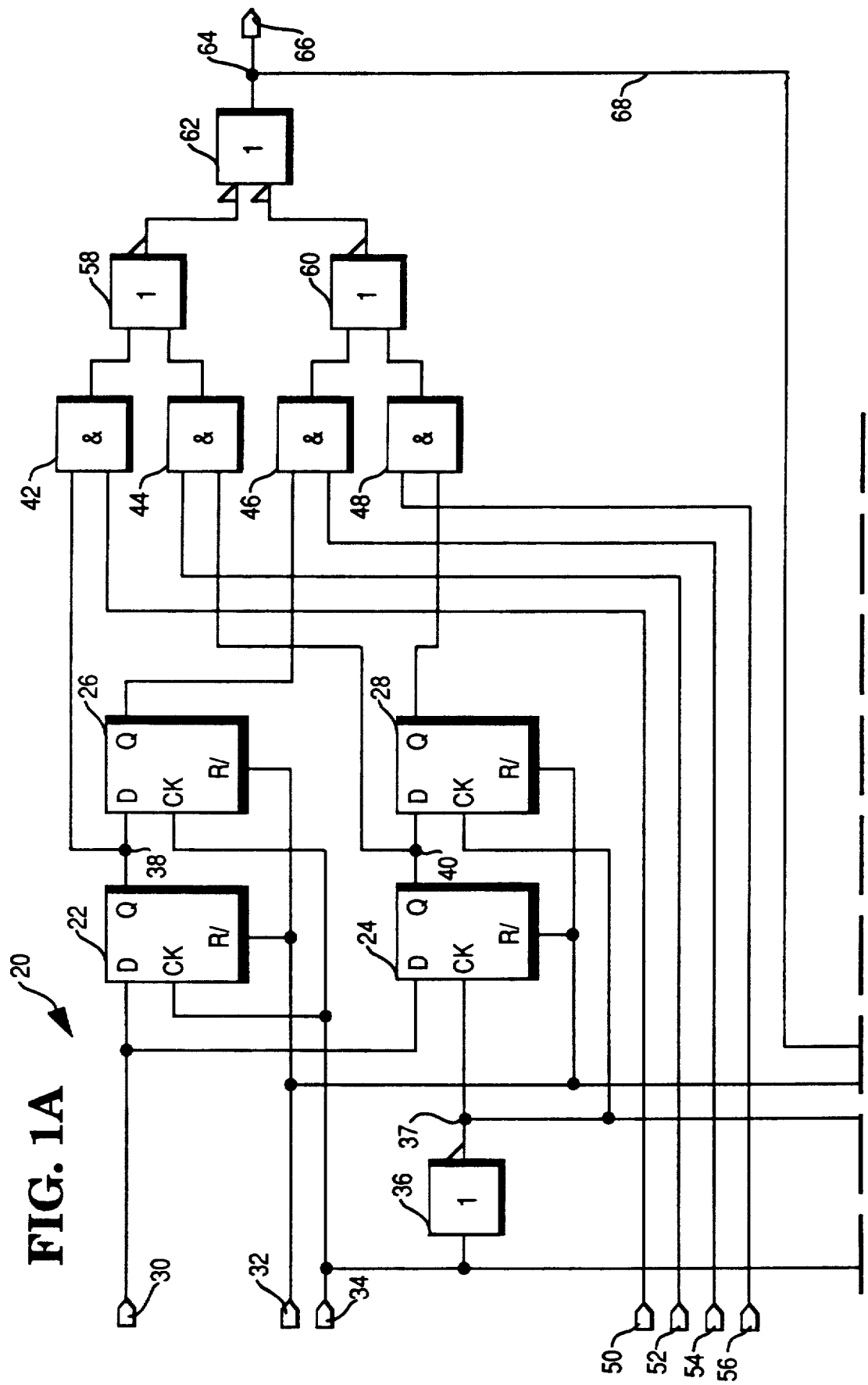
FIG. 1A and 1B, taken together, constitute a circuit diagram of the sequence control apparatus.
Figure 1B:
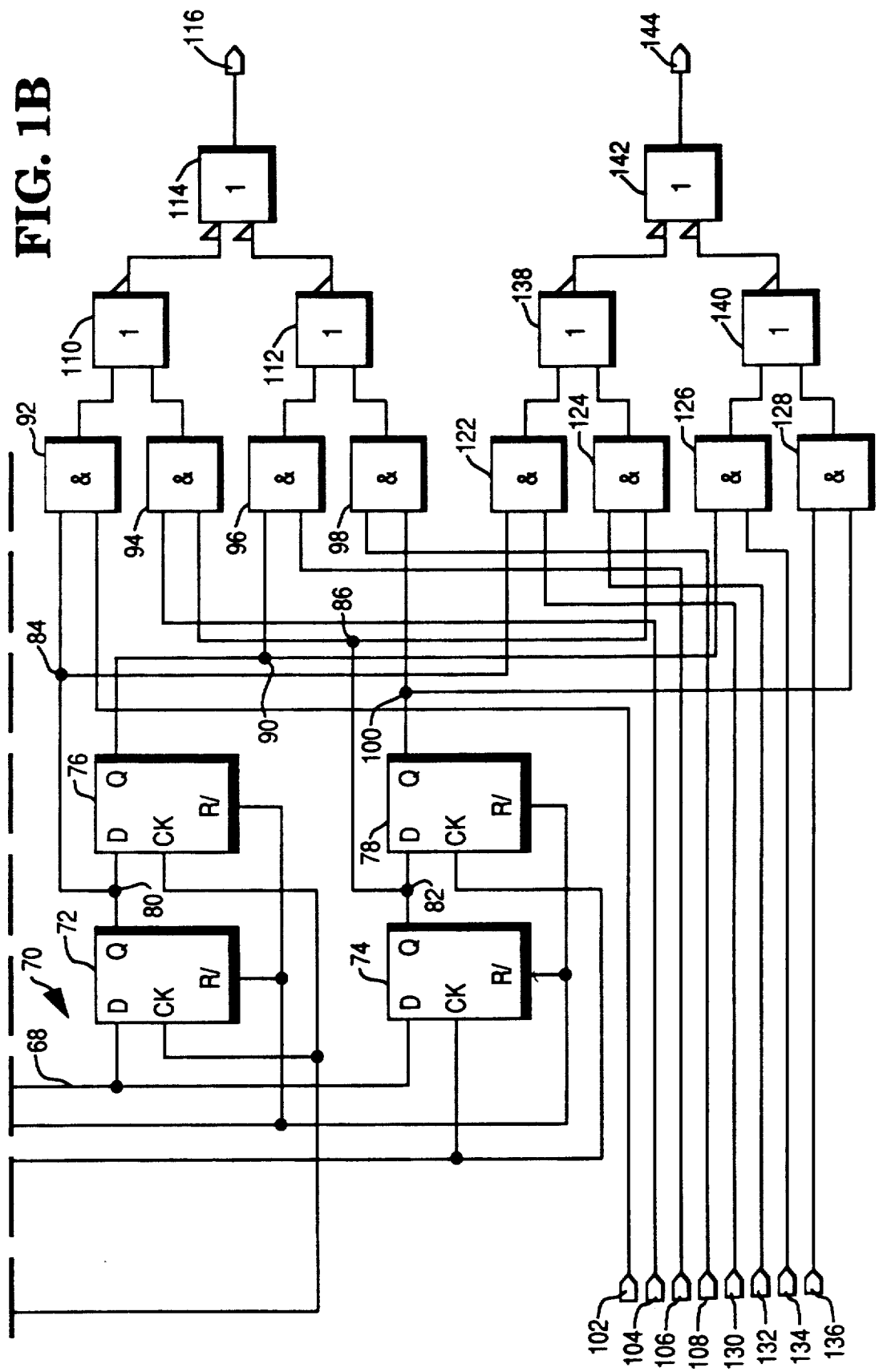

Referring now to the circuit diagram of FIGS. 1A and 1B, it should be noted that the components and connections shown therein can be implemented either in the form of integrated circuitry on a chip or in the form of discrete components. A first state machine or state controller 20 comprises four flip flops 22, 24, 26 and 28. These may be "D" type flip flops, with each flip flop including a data input designated "D", a clock input designated "CK", an active low reset input designated "R/" and a data output designated "Q".

A terminal 30 is coupled to the data inputs D of the flip flops 22 and 24, and provides a cycle start signal to said inputs. A terminal 32 is coupled to the reset inputs R/ of the flip flops 22, 24, 26 and 28, and provides a cycle end signal thereto. A terminal 34 is coupled to the clock inputs CK of the flip flops 22 and 26, and to the input of an inverter 36, and applies a clock signal thereto. The output of the inverter 36 is coupled through a node 37 to the clock inputs CK of the flip flops 24 and 28, and applies an inverted clock signal thereto. The data output Q of the flip flop 22 extends through a node 38 to the data input D of the flip flop 26, and the data output Q of the flip flop 24 similarly extends through a node 40 to the data input D of the flip flop 28.

The node 38 is also coupled to one input of a two-input AND gate 42, and the node 40 is also coupled to one input of a two-input AND gate 44. The data outputs Q of the flip flops 26 and 28 are coupled, respectively, to inputs of two other two-input AND gates 46 and 48. Terminals 50, 52, 54 and 56 are coupled to the other inputs of the AND gates 42, 44, 46 and 48 respectively. Logic select signals are applied to the terminals 50, 52, 54 and 56, and thence to the inputs of the AND gates 42, 44, 46 and 48 from other parts of the operating circuitry with which the state machine 20 is associated. These logic select signals may be generated, for example, from random access memory, settable switches, other flip flops, etc., and control the AND gates 42, 44, 46 and 48 to determine the particular output signal from one of the flip flops 22, 24, 26 and 28 which will be passed through the AND gates, as will subsequently be described in greater detail.

The outputs of the AND gates 42, 44 are coupled to inputs of a NOR gate 58. In a similar manner, the outputs of the AND gates 46, 48 are coupled to the inputs of a NOR gate 60. The outputs of the NOR gates 58 and 60 are coupled to the inputs of a two-input NAND gate 62. In the illustrated embodiment, the gate 62 is a De Morgan NAND gate, in which a low logic level on either input results in a high logic level on the output. The output of the NAND gate 62 is coupled through a node 64 to a terminal 66 which thus provides an output signal for the circuit described above. It will be noted that other combinations of various types of gates could be employed, if desired, to provide the same result.

From the node 64, a conductor 68 extends to the data inputs D of two flip flops 72 and 74 (FIG. 1B) which, together with additional flip flops 76 and 78, comprise a second state machine 70. The flip flops 72, 74, 76 and 78 are identical to the flip flops 22, 24, 26 and 28, and are interconnected in a similar manner. The cycle end signal from the terminal 32 is coupled to the reset inputs R/ of the flip flops 72, 74, 76 and 78. The clock signal from the terminal 34 is coupled to the clock inputs CK of the flip flops 72, 76 and the inverted clock signal from the inverter 36 is coupled to the clock inputs CK of the flip flops 74, 78. The data output Q of the flip flop 72 is coupled through a node 80 to the data input D of the flip flop 76, and the data output Q of the flip flop 74 is connected through a node 82 to the data input D of the flip flop 78.

The node 80 is also coupled through a second node 84 to one input of a two-input AND gate 92, and the node 82 is also coupled through a second node 86 to one input of a two-input AND gate 94. The data outputs of the flip flops 76 and 78 are coupled, respectively, through nodes 90 and 100, to inputs of two other two-input AND gates 96 and 98. Terminals 102, 104, 106 and 108 are coupled to the other inputs of the AND gates 92, 94, 96 and 98 respectively. Logic select signals are applied to the terminals 102, 104, 106, and 108, and thence to the inputs of the AND gates 92, 94, 96 and 98 from other parts of the operating circuitry with which the state machine 20 is associated. These logic select signals may be generated, for example, from random access memory, settable switches, other flip flops, etc., and control the AND gates 92, 94, 96 and 98 to determine the particular output signal from one of the flip flops 72, 74, 76 and 78 which will be passed through the AND gates, as will subsequently be described in greater detail. The outputs of the AND gates 92, 94 are coupled to inputs of a NOR gate 110. In a similar manner, the outputs of the AND gates 96, 98 are coupled to the inputs of a NOR gate 112. The outputs of the NOR gates 110 and 112 are coupled to the inputs of a two-input NAND gate 114. In the illustrated embodiment, the gate 114 is a De Morgan NAND gate, in which a low logic level on either input results in a high logic level on the output. The output of the NAND gate 114 is coupled to a terminal 116 which thus provides a second output signal for the circuit described above. It will be noted that other combinations of various types of gates could be employed, if desired, to provide the same result.

The node 84 is also coupled to one input of a two-input AND gate 122; the node 86 is also coupled to one input of a two-input AND gate 124; the node 90 is also coupled to one input of a two-input AND gate 126; and the node 100 is also coupled to one input of a two-input AND gate 128. Terminals 130, 132, 134 and 136 are coupled to the other inputs of the AND gates 122, 124, 126 and 128 respectively. Logic select signals are applied to the terminals 130, 132, 134, and 136, and thence to the inputs of the AND gates 122, 124, 126 and 128 from other parts of the operating circuitry with which the state machine 20 is associated. These logic select signals may be generated, for example, from random access memory, settable switches, other flip flops, etc., and control the AND gates 122, 124, 126 and 128 to determine the particular output signal from one of the flip flops 72, 74, 76 and 78 which will be passed through these AND gates, as will subsequently be described in greater detail. The outputs of the AND gates 122, 124 are coupled to inputs of a NOR gate 138. In a similar manner, the outputs of the AND gates 126, 128 are coupled to the inputs of a NOR gate 140. The outputs of the NOR gates 138 and 140 are coupled to the inputs of a two-input NAND gate 142. In the illustrated embodiment, the gate 142 is a De Morgan NAND gate, in which a low logic level on either input results in a high logic level on the output. The output of the NAND gate 142 is coupled to a terminal 144 which thus provides a third output signal for the circuit described above. It will be noted that other combinations of various types of gates could be employed, if desired, to provide the same result.

The signals appearing on the three output terminals 66, 116 and 144 may be employed for a number of purposes, depending upon the use for which the circuitry is intended. For example, the state machine 20 may be employed in a memory control circuit, in which case the signal on the terminal 66 may be used to activate a row address strobe signal which is applied to a dynamic random access memory; the signal on the terminal 116 may be used to activate a multiplex address switch signal that switches from row address to column address; and the signal on the terminal 144 may be used to activate a column address strobe signal which is applied to the dynamic random access memory.

It should further be noted that the circuitry of FIGS. 1A and 1B is illustrative only. The circuit shown therein could be extended to provide additional outputs and further timing differentiation, if desired, by adding additional groups of flip flops which are coupled to the preceding group and to each other in the manner shown in the coupling of the flip flops 72, 74, 76, 78 to the flip flops 22, 24, 26, 28, in which the output of the gate 62 is coupled to the input of the flip flop 72.

Figure 2:
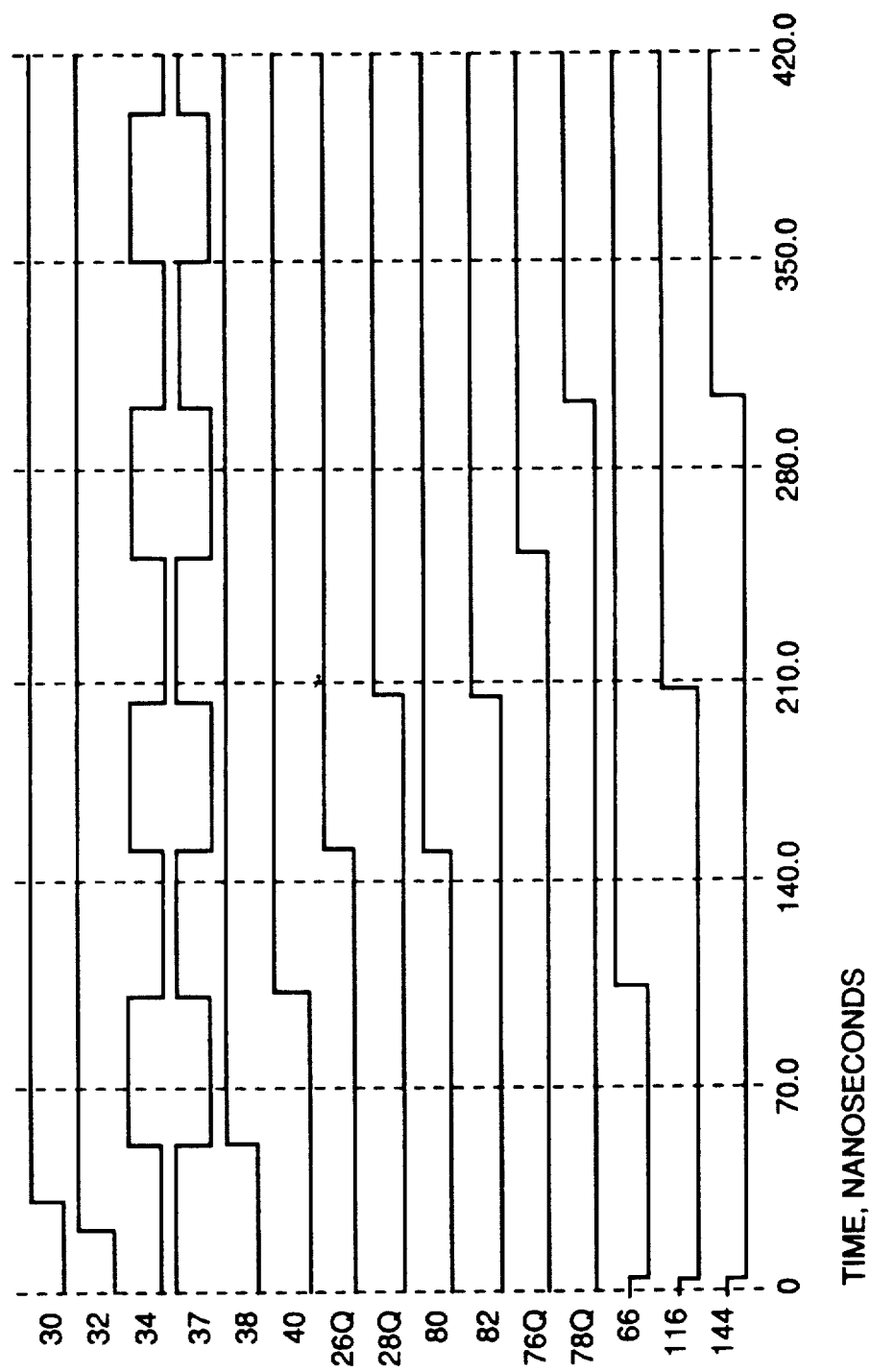
FIG. 2 shows a group of waveforms, taken at various points in the circuit of FIGS. 1A and 1B.

Referring now to FIG. 2, shown there are a plurality of wave forms, plotted with respect to time in nanoseconds, comprising the major signals associated with the circuit of FIGS. 1A and 1B. These wave forms are taken at various points on the circuit, and are identified by the reference characters associated with such points. Thus, for example, the wave form designated 30 in FIG. 2 is the cycle start signal which is applied to the terminal 30 in FIG. 1A. In brief summary, the cycle end signal 32 clears the flip flops 22, 24, 26, 28, 72, 74, 76, and 78, and prepares the circuit for the first cycle. The cycle start signal 30 begins the sequence of events. When the signal 30 goes active, the next rising edge of the clock signal 34 operates the flip flop 22. The next rising of the inverted clock signal 37 operates the flip flop 24. The following rising edge of the clock signal 34 operates the flip flop 26, which has received a signal at its "D" input from the "Q" output of the flip flop 22, and the following rising edge of the inverted clock signal 37 operates the flip flop 28, which has received a signal at its "D" input from the "Q" output of the flip flop 24.

The logic input signals 50, 52, 54 and 56 are not included in the wave forms of FIG. 2, because the levels of the signals (either high or low) do not change during a cycle of operation. It will be assumed for purposes of explanation that signal 52 has been selected to be at a high logic level, and that signals 50, 54 and 56 have been selected to be at a low logic level. In such a case, the AND gate 44 will pass the "Q" output signal 40 from the flip flop 24. This high level signal produces a low output from the NOR gate 58, which in turn produces a high output from the NAND gate 62, and from the output terminal 66.

The output signal from the NAND gate 62 is also applied over the conductor 68 to the "D" inputs of the flip flops 72 and 74. The next rising edge of the clock signal 34 causes the flip flop 72 to be operated, which produces a high-level output signal from the output "Q". In a manner similar to that described above, high-level output signals from the outputs "Q" for the flip flops 74, 76 and 78 are subsequently produced on consecutive rising and falling edges of the clock signal 34. Output signals from the NAND gates 114 and 142 are produced in accordance with which logic input signals from the group 102-108 and the group 130-136 are selected.

Figure 3:
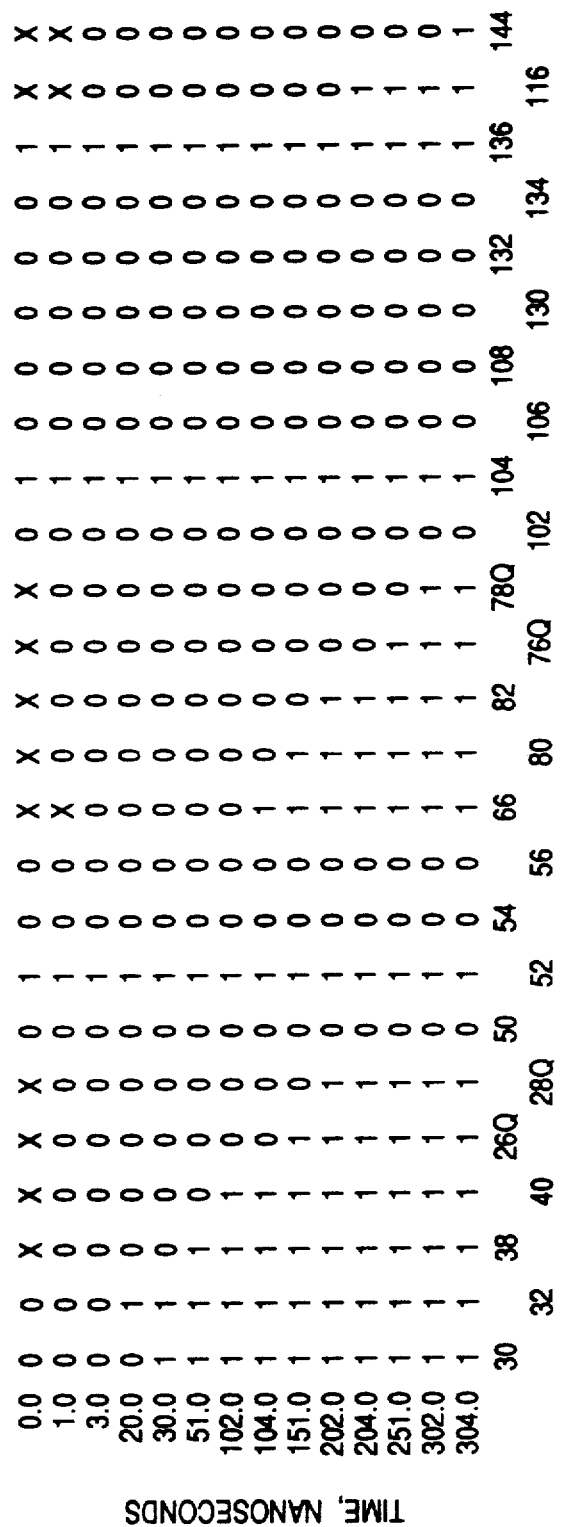
FIG. 3 is a table showing logic levels of certain signals of the circuit of FIGS. 1A and 1B, and showing the stepping of various signals on both the rising and falling edges of a clock signal.

The table of FIG. 3 contains a listing of most of the signals shown in FIG. 2, identifying them by the reference numbers used in FIG. 2. A high logic level is represented by "1", a low logic level is represented by "0", and an undefined state (prior to a reset operation) is shown by "X". The specific values of time in nanoseconds shown at the left of the table are those at which a change of signal level of one of the signals takes place. The specific times are relative to the clock frequency of the clock input applied to the terminal 34. The table of FIG. 3 shows the stepping of signals 38, 40, 26Q, 28Q, 80, 82, 76Q and 78Q on both rising and falling edges of the clock signal, thus giving the performance of a normal single edge state machine running at twice the frequency of the present circuit. It will be noted that the logic input signals on the terminals 50, 52, 54, 56, 102, 104, 106, 108, 130, 132, 134 and 136 are also included in the table of FIG. 3, as are the output signals 66, 116 and 141.

Figure 4:
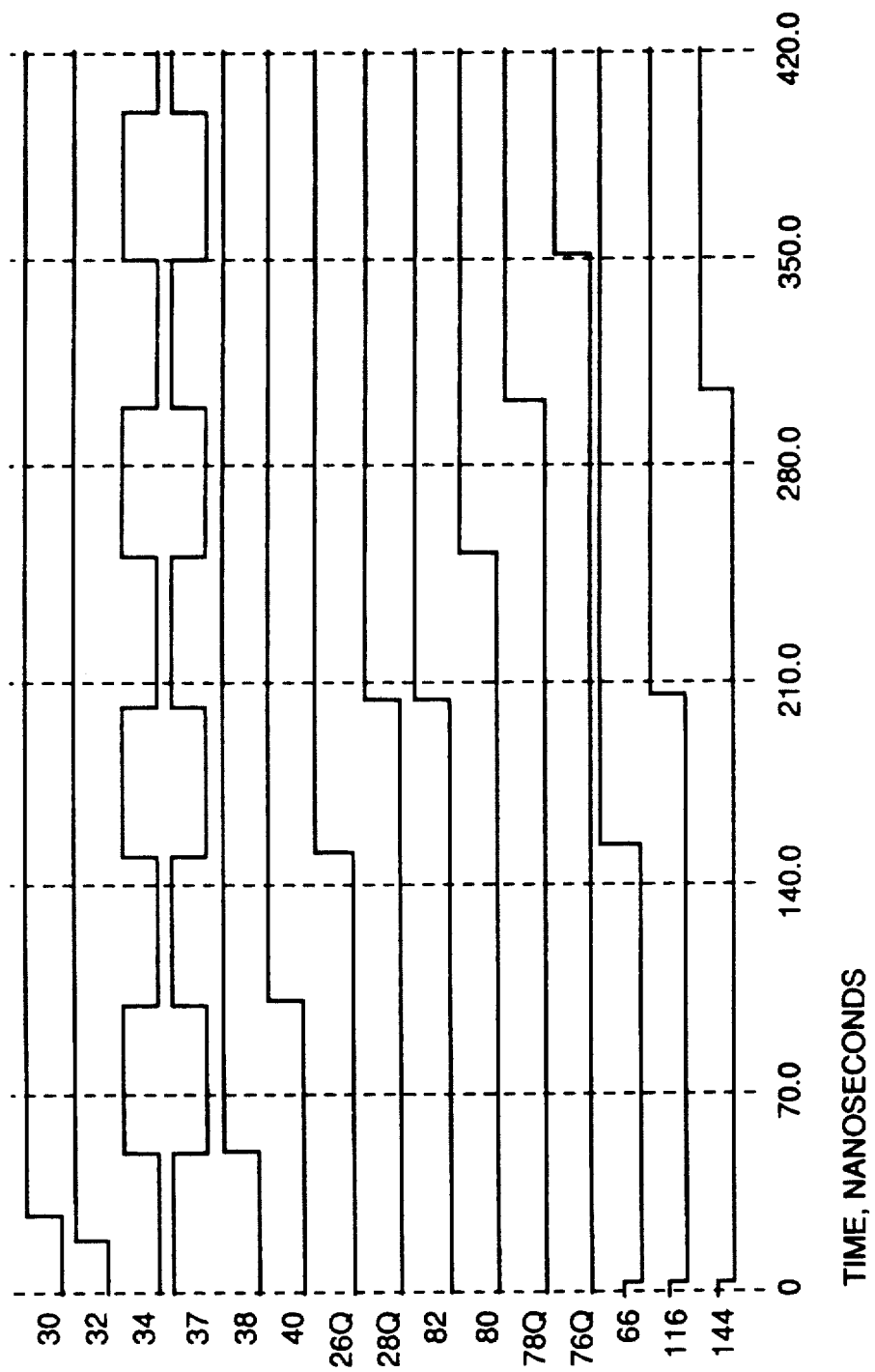
FIG. 4 shows a group of waveforms, and is similar to FIG. 2, except that an output signal is generated a half clock signal later.

Shown in FIG. 4 are a plurality of wave forms which are similar to those of FIG. 2, except that the output signal 66 is generated a half clock signal later. It will be seen that the order of operation of the flip flops 72, 74, 76 and 78 has been altered, since the output signal 66 is generated from a rising edge of the clock signal 34. The flip flop 74 is operated before the flip flop 72, and the signal 82 thus shifts to a high logic level before the signal 80. It may be noted that the outputs 116 and 144 shift to an active state, or a high logic level, at the same absolute time in FIG. 4 as in FIG. 2, although the time difference between the changes in logic levels of these signals and that of the signal 66 is different in FIG. 4 from that of FIG. 2.

Figure 5:
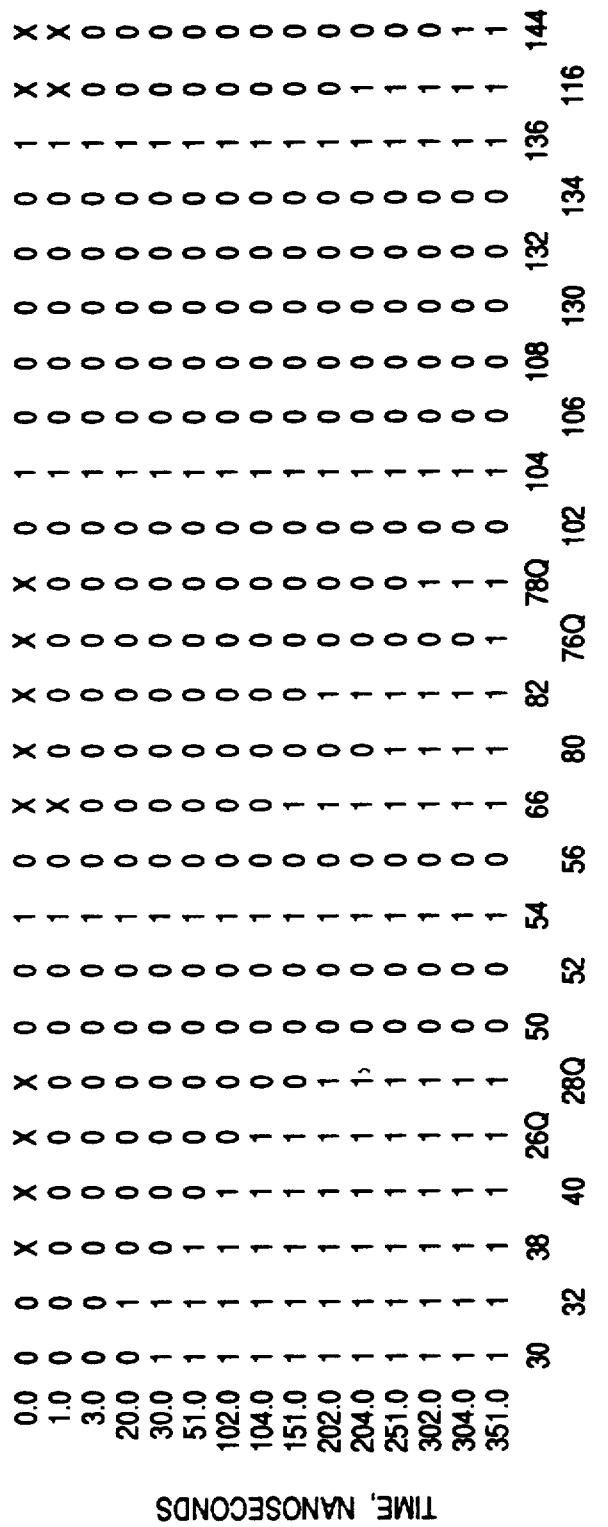
FIG. 5 is a table similar to the table of FIG. 3, showing the stepping of certain signals in accordance with the waveforms of FIG. 4.

The table of FIG. 5 contains a listing of most of the signals shown in FIG. 4, identifying them by the reference numbers used in FIG. 4. As in FIG. 3, a high logic level is represented by "1", a low logic level is represented by "0", and an undefined state (prior to a reset operation) is shown by "X". The specific values of time in nanoseconds shown at the left of the table are those at which a change of signal level of one of the signals takes place. The specific times are relative to the clock frequency of the clock input applied to the terminal 34. Also as in FIG. 3, the table of FIG. 5 shows the stepping of signals 38, 40, 26Q, 28Q, 80, 82, 76Q and 78Q on both rising and falling edges of the clock signal. It will be noted that the logic input signals on the terminals 50, 52, 54, 56, 102, 104, 106, 108, 130, 132, 134 and 136 are also included in the table of FIG. 5, as are the output signals 66, 116 and 141, and that logic input signal 54 is active instead of logic input signal 52, thus delaying the output signal 66 (which may be the row address strobe signal) by one half clock cycle.

Figure 6:
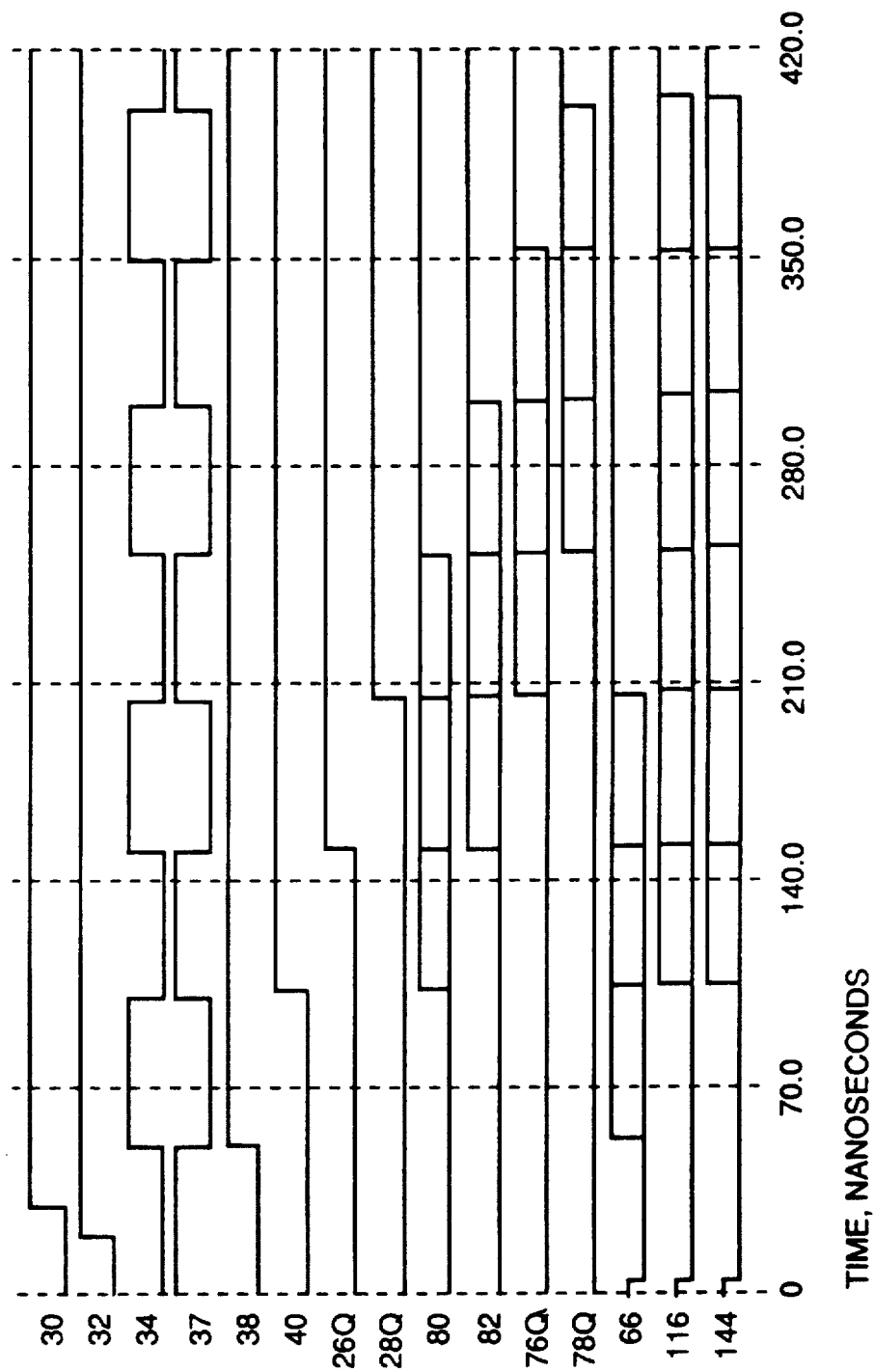
FIG. 6 shows a group of waveforms associated with the circuit of FIGS. 1A and 1B, and illustrates the programmability which can be used in the present invention to obtain different timing of various signals.

FIG. 6 demonstrates the programmability inherent in the present design. The output signal 66 can be generated off any of four different clock edges. The changes in output signal level from the flip flops 72, 74, 76 and 78 can be caused to take place at any of several times. The output signals 116 and 144 gain from the flexibility of their own programmability as well as that of the signal 66, and can thus be generated from seven edges instead of four. Additional groups of bistable devices similar to the groups 20 and 70 could be added to the illustrated circuit arrangement, thus further expanding the flexibility of the circuit. It will thus be seen that an extremely flexible circuit can be provided, using a relatively small number of flip flops.

Figure 7:
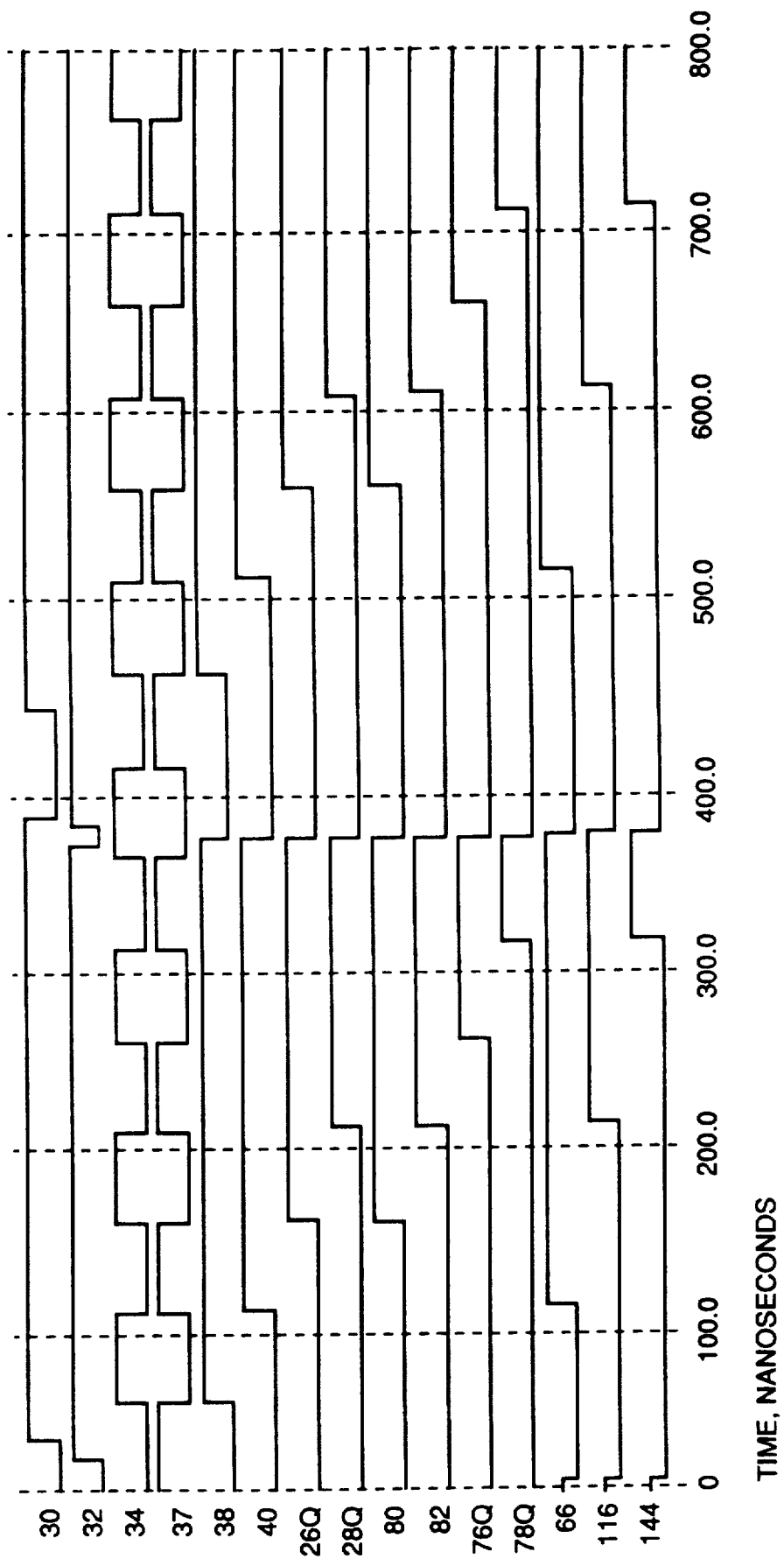
FIG. 7 shows a group of waveforms associated with the circuit of FIGS. 1A and 1B, in which one cycle of operation has been completed and another is commenced.

FIG. 7 shows two consecutive cycles of the circuit. The cycle end signal 32 clears all of the flip flops of the circuit, and the cycle start signal 30 begins the next cycle. Once the preceding cycle has been completed and the next cycle has begun, the circuit operates in the manner previously described to generate the signals required.

While the form of the invention shown and described herein is admirably adapted to fulfill the objects primarily stated, it is to be understood that it is not intended to confine the invention to the form or embodiment disclosed herein, for it is susceptible of embodiment in various other forms within the scope of the appended claims.

What is claimed is:

1. Sequence control apparatus for providing a plurality of output signals selectively based upon either a rising edge of a clock signal or a falling edge of a clock signal, comprising:

clock input signal means;

clock input signal inverter means having an input coupled to the clock input signal means and an output;

state controller means comprising a first plurality of devices clocked by said clock input signal means and a second plurality of devices clocked by signals from the output of said clock signal inverter means and which can produce a plurality of output signals;

means to initiate operations of said state controller means;

gating means coupled to said state controller means to receive a plurality of said output signals from said state controller means and having output means on which appears an output signal for the sequence control apparatus;

logic select input means coupled to said gating means for selecting a desired one of the output signals from said state controller means to appear on the output means of the gating means;

second state controller means comprising a first plurality of devices clocked by said clock input signal means and a second plurality of devices clocked by signals from the output of said clock signal inverter means, and which can produce a plurality of output signals;

means for coupling the output means of said gating means to said second state controller means to perform operation thereof;

second gating means coupled to said second state controller means to receive a plurality of said output signals from said second state controller means and having an output means on which appears a second output signal for the sequence control apparatus; and second logic select input means coupled to said second gating means for selecting a desired one of the output signals from said second state controller means to appear on the output means of the second gating means.

2. The sequence control apparatus of claim 1, also comprising:
third gating means coupled to said second state controller means to receive a plurality of output signals from said second state controller means and having an output means on which appears a third output signal for the sequence control apparatus; and
third logic select input means said third gating means for selecting a desired one of the output signals from the second state controller means to appear on the output of the third gating means.

3. The sequence control apparatus of claim 1, in which the devices of the state controller means and the second state controller means are flip flops.

4. The sequence control apparatus of claim 2, in which the devices of the state controller means and the second state controller means are flip flops.

5. Sequence control apparatus for providing a plurality of output signals selectively based upon either a rising edge of a clock signal or a falling edge of a clock signal, comprising:
first, second, third and fourth bistable means, each having a reset input, a clock, input, a data input and a data output;
means coupled the data output of the first bistable means to the data input of the third bistable means;
means coupling the data output of the second bistable means to the data input of the fourth bistable means;
clock input signal means coupled to the clock inputs of the first and third bistable means;
clock inverter means having an input coupled to the clock input means and an output;
means coupling the output of the clock inverter means to the clock inputs of the second and fourth bistable means;
reset signal means coupled to the reset inputs of the first, second, third and fourth bistable means;
start cycle input means coupled to the data inputs of the first and second bistable means;
first, second, third and fourth gate means of a first type, said first gate means of the first type having one input coupled to an output of the first bistable means, said second gate means of the first type having one input coupled to an output of the second bistable means, said third gate means of the first type having one input coupled to an output of the third bistable means, and said fourth gate means of the first type having one input coupled to an output of the fourth bistable means;
first logic second input means coupled to a second input of said first gate means of the first type of selecting the output of said first gate means of the first type;
second logic select input means coupled to a second input of said second gate means of the first type for selecting the output of said second gate means of the first type;
third logic select input means coupled to a second input of said third gate means of the first type for selecting the output of said third gate means of the first type;
fourth logic select input means coupled to a second input of said fourth gate means of the first type for selecting the output of said fourth gate means of the first type;
first gate means of a second type coupled to the outputs of said first and second gate means of the first type;
second gate means of a second type coupled to the outputs of said third and fourth gate means of the first type; and
first gate means of a third type coupled to the outputs of said first and second gate means of the second type and having output means on which appears an output signal for the sequence control apparatus.

6. The sequential control apparatus of claim 5, in which the bistable means are flip flops.

7. The sequential control apparatus of claim 5, in which the gate means of the first type are AND gates.

8. The sequential control apparatus of claim 5, in which the gate means of the second type are NOR gates.

9. The sequential control apparatus of claim 5, in which the gate means of the third type is a NAND gate.

10. The sequence control apparatus of claim 5, also comprising:
fifth, sixth, seventh and eighth bistable means, each having a reset input, a clock input, a data input and a data output;
means coupling the output of the first gate means of the third type to the data inputs of the fifth and sixth bistable means;
means coupling the data output of the fifth bistable means to the data input of the seventh bistable means;
means coupling the data output of the sixth bistable means to the data input of the eighth bistable means;
means coupling the clock input signal means to the clock inputs of the fifth and seventh bistable means;
means coupling the output of the clock inverter means to the clock inputs of the sixth and eighth bistable means;
means coupling the reset signal means to the reset inputs of the fifth, sixth, seventh and eighth bistable means;
fifth, sixth, seventh and eighth gate means the first type, said fifth gate means of the first type having an input coupled to an output of the fifth bistable means, said sixth gate means of the first type having an input coupled to an output of the sixth bistable means, said seventh gate means of the first type having an input coupled to an output of the seventh bistable means, and said eighth gate means of the first type having an input coupled to an output of the eighth bistable means;
fifth logic select input means coupled to a second input of said fifth gate means of the first type;
sixth logic select input means coupled to a second input of said sixth gate means of the first type;
seventh logic select input means coupled to a second input of said seventh gate means of the first type;
eighth logic select input means coupled to a second input of said eighth gate means of the first type;
third gate means of the second type coupled to the outputs of said fifth and sixth gate means of the first type;
fourth gate means of the second type coupled to the outputs of said seventh and eighth gate means of the first type; and
second gate means of the third type coupled to the outputs of said third and fourth gate means of the second type and having output means on which appears an output signal for the sequence control apparatus.

11. The sequence control apparatus of claim 10, also comprising:
ninth, tenth, eleventh and twelfth gate means of the first type, said ninth gate means of the first type having an input coupled to an output of the fifth bistable means, said tenth gate means of the first type having an input coupled to an output of the sixth bistable means, said eleventh gate means of the first type having an input coupled to an output of the seventh bistable means, and said twelfth gate means of the first type having an input coupled to an output of the eighth bistable means;
ninth logic select input means coupled to a second input of said ninth gate means of the first type;
tenth logic select input means coupled to a second input of said tenth gate means of the first type;
eleventh logic select input means coupled to a second input of said eleventh gate means of the first type;
twelfth logic select input means coupled to a second input of said twelfth gate means of the first type;
fifth gate means of the second type coupled to the outputs of the ninth and tenth gate means of the first type;
sixth gate means of the second type coupled to the outputs of the eleventh and twelfth gate means of the first type; and
third gate means of the third type coupled to the outputs of said fifth and sixth gate means of the second type and having output means on which appears an output signal for the sequence control apparatus.

12. The sequential control apparatus of claim 10, in which the bistable means are flip flops.

13. The sequential control apparatus of claim 10, in which the gate means of the first type are AND gates.

14. The sequential control apparatus of claim 10, in which the gate means of the second type are NOR gates.

15. The sequential control apparatus of claim 10, in which the gate means of the third type are NAND gates.

16. The sequential control apparatus of claim 11, in which the bistable means are flip flops.

17. The sequential control apparatus of claim 11, in which the gate means of the first type are AND gates.

18. The sequential control apparatus of claim 11, in which the gate means of the second type are NOR gates.

19. The sequential control apparatus of claim 11, in which the gate means of the third type are NAND gates.

20. The sequential control apparatus of claim 11, in which the output of the first gate means of the third type is an activating signal for a memory row address strobe signal.

21. The sequential control apparatus of claim 11, in which the output of the second gate means of the third type is an activating signal for a multiplex address switch signal.

22. The sequential control apparatus of claim 11, in which the output of the third gate means of the third type is an activating signal for a memory column address strobe signal.

23. Sequence control apparatus for providing a plurality of output signals selectively based upon either a rising edge of a clock signal or a falling edge of a clock signal, comprising:
first, second, third and fourth flip flop means each having a reset input, a clock input, a data input and a data output;
means coupling the data output of the first flip flop means to the data input of the third flip flop means;
means coupling the data output of the second flip flop means to the data input of the fourth flip flop means;
clock input signal means coupled to the clock inputs of the first and third flip flop means;
clock inverter means having an input coupled to the clock input means and an output;
means coupling the output of the clock inverter means to the clock inputs of the second and fourth flip flop means;
reset signal means coupled to the reset inputs of the first, second, third and fourth flip flop means;
start cycle input means coupled to the data inputs of the first and second flip flop means;
first, second, third and fourth AND gate means, said first AND gate means having one input coupled to an output of the first flip flop means, said second AND gate means having one input coupled to an output of the second flip flop means, said third AND gate means having one input coupled to an output of the third flip flop means, and said fourth AND gate means having one input coupled to an output of the fourth flip flop means;
first logic select input means coupled to a second input of said first AND gate means for selecting the output of said first AND gate means;
second logic select input means coupled to a second input of said second AND gate means for selecting the output of said second AND gate means;
third logic select input means coupled to a second input of said third AND gate means for selecting the output of said third AND gate means;
fourth logic select input means coupled to a second input of said fourth AND gate means for selecting the output of said fourth AND gate means;
first NOR gate means coupled to the outputs of said first and second AND gate means;
second NOR gate means coupled to the outputs of said third and fourth AND gate means; and
NAND gate means coupled to the outputs of said first and second NOR gate means and having output means on which appears an output signal for the sequence control apparatus.

* * * * *

UNITED STATES PATENT AND TRADEMARK OFFICE
CERTIFICATE OF CORRECTION

PATENT NO. : 5,261,081
DATED : November 9, 1993
INVENTOR(S) : Daniel F. White et al.

It is certified that error appears in the above-identified patent and that said Letters Patent is hereby corrected as shown below:

Column 9, line 10, after "means" insert --coupled to--.

Column 9, line 27, "coupled" should be --coupling--.

Column 9, line 53, "second" first occurrence, should be --select--.

Column 9, line 54, "of" third occurrence, should be --for--.

Column 10, line 42, after "means" insert --of--.

Signed and Sealed this

Twenty-eighth Day of June, 1994

Attest:

BRUCE LEHMAN

*Attesting Officer*  Commissioner of Patents and Trademarks